United States Patent [19]

Numata et al.

[11] Patent Number: 4,777,655
[45] Date of Patent: Oct. 11, 1988

[54] CONTROL SIGNAL RECEIVING SYSTEM

[75] Inventors: Osamu Numata; Yoshitomo Kuwamoto; Hiroshi Shirai, all of Katsuta; Shinichi Hagiya, Nakamachi, all of Japan

[73] Assignee: Hitachi, Ltd., Tokyo, Japan

[21] Appl. No.: 935,717

[22] Filed: Nov. 28, 1986

[30] Foreign Application Priority Data

Nov. 28, 1985 [JP] Japan .................... 60-266075

[51] Int. Cl.$^4$ ............... H04B 1/40; H04B 1/16
[52] U.S. Cl. .................... 455/76; 455/260; 455/343
[58] Field of Search ............ 455/32, 33, 38, 54, 455/76, 343, 165, 183, 260; 375/106, 114, 81, 82; 331/2, 14

[56] References Cited

U.S. PATENT DOCUMENTS

| 4,449,248 | 5/1984 | Leslie et al. | 455/38 |
| 4,481,675 | 11/1984 | Ichikawa et al. | 455/38 |
| 4,598,258 | 1/1986 | Babano | 455/343 |
| 4,625,180 | 11/1986 | Itaya et al. | 455/343 |
| 4,652,875 | 3/1987 | Waki | 455/343 |
| 4,667,169 | 5/1987 | Matsuura et al. | 455/343 |
| 4,673,892 | 6/1987 | Miyashita et al. | 455/343 |

Primary Examiner—Robert L. Griffin
Assistant Examiner—Curtis Kuntz
Attorney, Agent, or Firm—Antonelli, Terry & Wands

[57] ABSTRACT

A necessary signal portion of a control signal transmitted from a land station of a mobile telecommunication system during an idle period thereof is received intermittently by a mobile station, with an initial unstable operation period of the mobile station occurring in a period of an unnecessary signal portion of the control signal and a subsequent stable operation period thereof occurring in a period of the necessary signal portion of the control signal.

6 Claims, 3 Drawing Sheets

CONTROL SIGNAL RECEIVING SYSTEM

BACKGROUND OF THE INVENTION

The present invention relates to a control signal receiving method and system for use in receiving a control signal in, for example, a cellular mobile telecommunication system in which the control signal is transmitted in an idle period during which message is absent and, particularly, to such method and system by which a power consumption during the idle period is minimized.

A mobile telecommunication system in which a service area is divided into a plurality of cells and a common frequency is used for all of the cells is known as the cellular mobile telecommunication system. In this system, a telephone communication between a stationary telephone set and a mobile station mounted on a vehicle in the service area is made possible through a land station provided for each cell and the land station exchanges control signals with the mobile station to monitor a location of the mobile station so that the communication between the stationary set and the mobile station can be performed under an optimal condition.

A construction of the mobile station to be used in such cellular telecommunication system is shown in FIG. 1. As shown in FIG. 1, the mobile station comprises an antenna 1, an antenna duplexer 2 connected to the antenna 1, a receiver section 3 connected to the antenna duplexer 2, a PLL synthesizer section 4, a transmitter section 5, a data modem/ control section 6 and a telephone set 7. A circuit construction of the PLL synthesizer section 4 is shown in FIG. 2.

In FIG. 1, a message signal (audio signal) transmitted from a stationary telephone set through a land station during a talking period is received by the antenna 1 and fed through the antenna duplexer 2 to the receiver section 3. In the receiver section 3, the signal is converted by an output of the PLL synthesizer section 4 into an IF signal which is sent to the telephone set 7 after being detected. On the other hand, an audio signal produced by the telephone set 7 is fed to the transmitter section 5 and, after modulation by the data modem/control section 6, converted by an output of the PLL synthesizer section 4 into a transmission frequency which is transmitted through the antenna duplexer 2 and the antenna 1.

In the audio communication performed in this manner, a control signal is exchanged between the land station and the mobile station during the idle period where audio signal is absent. The control signal from the land station may include any one or more of data signals including a location information for identifying a cell where the mobile station locates a channel control signal for informing a control channel in that cell, an interrogation signal to be received by a mobile station assigned by a stationary set and a channel assigning signal for assigning a communication channel to a mobile station, etc. The control signal to be sent by the mobile station may include any one or more of data signals including a response signal to an interrogation from the land station, an interrogation signal for interrogating a stationary set and a location registration signal for informing the land station of a cell where the mobile station is currently located, etc.

The control signal received by the mobile station is converted in the receiver section 3 into the IF signal and fed to the control section 6 for demodulation in the same way as that for the audio signal.

In response to the control signal from the land station or when an audio communication is to be started, a data signal such as the response signal, the interrogation signal and/or the location signal is formed in the control section 6 and it is modulated to form the control signal. The control signal thus formed is modulated, frequency-converted and then transmitted through the antenna 1.

These operations are performed under the control of the control section 6. The PLL synthesizer section 4 functions to convert the received signal into an IF signal of a specific frequency and to provide a signal having a frequency necessary to convert a signal to be transmitted thereby into a signal having a frequency assigned thereto by the land station as mentioned previously. The number of the control channels for the control signal transmission and the number of channels necessary for audio communication are usually very large and, for that reason, it is necessary to change the output frequency of the PLL synthesizer section 4 according to the channel to be used. This is performed under the control of the control section 6.

The control signal to be transmitted by the land station is typically composed of a repetition of signal frames each including a bit synchronizing signal of, for example, 10 bits, a word synchronizing signal of 11 bits and a data stream portion in the order, as shown in FIG. 3. The data stream portion is composed of a group A of data streams A1, A2, A3, A4 and A5 and a group B of data streams B1, B2, B3, B4 and B5, for example. The data stream groups A and B are arranged alternately as shown. The data streams of the group A contain identical data and those of the group B contain identical data different from that of the Group A.

Each data stream is of 40 bits and a busy/idle (B/I) information of 1 bit is inserted into a place preceding the bit synchronizing signal and a place preceding the word synchronizing signal, respectively. Four of such B/I informations are inserted into each data stream, as shown by arrows in FIG. 3. Therefore, one frame is composed of 463 bits. A transmission rate of this control signal is usually 10K bits/sec and therefore 1 frame transmission requires 46.3 msec and 1 data signal transmission requires about 4 msec.

As mentioned previously, there are a plurality of control channels for each cell. Therefore, when a mobile station enters into a new cell, the PLL synthesizer section 4 thereof changes its output frequency sequentially under the control of the control section 6 to perform a frequency scanning to find out a control channel whose field intensity is maximum, by detecting the receiving level of the control signal. When an optimum control channel is found, the location of the mobile station is registered for that channel and a subsequent transmission of the control signal is performed by using that channel.

Therefore, in order to obtain a best receiving condition in the selected channel, an output frequency of the PLL synthesizer section 4 has to be maintained at a value corresponding to the optimum channel. In order to provide this condition, the control section 6 monitors the signal level of the receiving control signal during the idle time period in which there is neither interrogation nor registration of location to control the PLL synthesizer section 4 so that the control signal in the selected control channel can be received with maximum field intensity.

In the case of the control signal shown in FIG. 3, it is enough for the control section 6 to monitor either the data stream A or B. Assuming that the data stream A is to be monitored, the monitoring can be performed intermittently. In such case, the output frequency of the PLL synthesizer section 4 is controlled such that the signal level of, for example, the stream A1 becomes a maximum. With such intermittent reception of the stream A1, it is possible to minimize a power consumption of the mobile set.

As shown in FIG. 2, the PLL synthesizer section 4 comprises a voltage controlled oscillator (VCO) 13, a frequency divider stage 20 for dividing an output frequency of the VCO 13, a phase comparator 12 for comparing a phase of an output signal of the frequency divider stage 20 with a reference phase 22 and a charge pump 14 including a capacitor for holding a phase difference signal from the comparator 12, the output frequency of the voltage controlled oscillator 13 being controlled according to an output voltage of the charge pump 14. The output of the VCO 13 corresponds to the output of the PLL synthesizer section 4 and the output frequency of the VCO 13 can be changed by changing a dividing ratio of the frequency divider stage 20 by means of the control section 6.

In such PLL synthesizer section 4, the frequency divider stage 20 comprises a prescaler 11 having a pair of dividing ratios which are selectable and a variable frequency divider 10 whose dividing ratio can be controlled by the control section 6. The use of such prescaler 11 is due to the facts that the output frequency of the VCO 13 must be divided substantially and that the output frequency as high as, for example, 800 MHz of the VCO 13 requires a very high dividing rate. Since, when the prescaler 11 is used, a large current flows through the prescaler necessarily for the reason mentioned above, the power consumption thereof becomes considerable.

In order to minimize such large power consumption of the prescaler, Japanese Patent Application Laid-Open No. 157142/1981 proposes a system in which, during reception the data stream of the group A, power is supplied to the prescaler to make it operative and, during reception the data stream of the group B, the power supply to the prescaler is terminated. Although there is no phase difference signal provided by the phase comparator at a time period in which no power is supplied to the prescaler, the operation of the VCO can be maintained by a phase difference signal stored in the charge pump. Since the time period in which the prescaler consumes power is reduced in this manner, a reduction of power consumption is realized.

When the prescaler is deenergized, the output frequency of the VCO reduces gradually with time, a reduction rate being determined by a discharge time constant of the charge pump which can be selected such that the output frequency does not affect the signal receiving operation substantially for a desired time. However, when the prescaler is energized, there is a transient phenomenon of the VCO upon which the output frequency of the PLL synthesizer section fluctuates substantially, causing a monitoring of the necessary data stream to be impossible for at least such fluctuating time.

SUMMARY OF THE INVENTION

An object of the present invention is, therefore, to provide an intermittent signal receiving method of a control signal composed of a series of signal frames each including a synchronizing signal portion followed by a control data portion composed of alternately arranged at least two kinds of data streams, by which monitoring of a desired data stream arranged intermittently can be performed reliably, while attaining a considerable reduction of power consumption.

Another object of the present invention is to provide a system for performing the same method.

In order to achieve the above objects, the present invention utilizes the fact that the data stream of the control signal which is to be monitored and that which is not to be monitored are arranged alternately in the control signal.

According to the present invention, a prescaler of a PLL synthesizer of a mobile station is started to operate during the unnecessary data stream of the control signal so that a transient period of a voltage-controlled oscillator in which it is not stable occurs within the period of the unnecessary data stream and the necessary data stream is received in a subsequent stable operation period thereof.

The above and other objects and features of the present invention will become apparent from the following detailed description of preferred embodiments of the present invention with reference to the accompanying drawings.

DETAILED DESCRIPTION OF THE PREFERRED EMBODIMENTS

Figure 1:
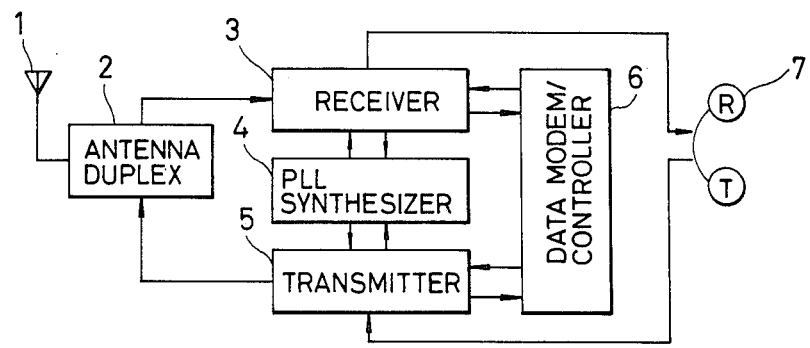
FIG. 1 is a block diagram showing a general construction of a mobile station to be used in the cellular mobile telecommunication system.
Figure 2:
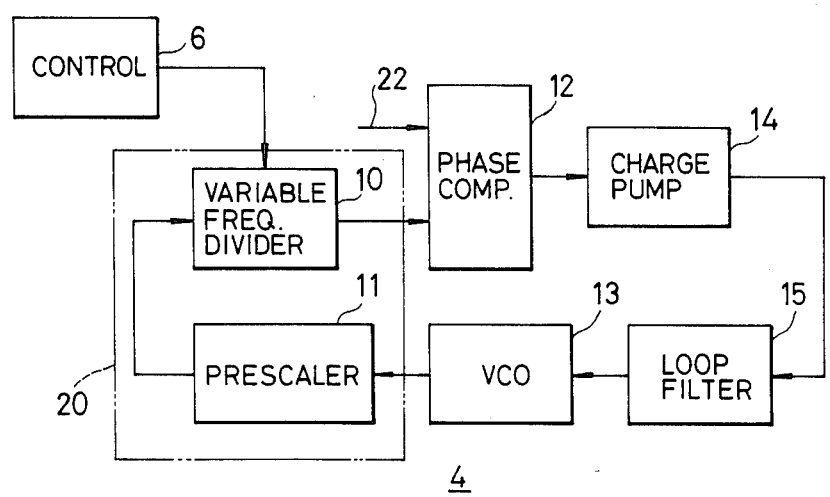
FIG. 2 is a block diagram of a PLL synthesizer section of the mobile station shown in FIG. 1.
Figure 4:
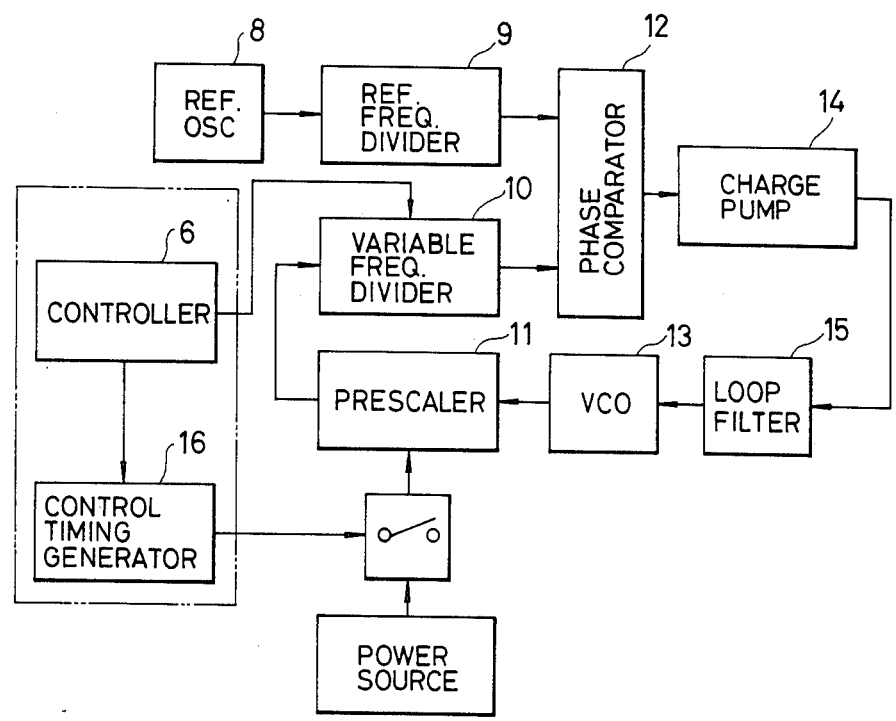
FIG. 4 is a block diagram showing an embodiment of the control signal receiving system according to the present invention.

In FIG. 4 which shows a block circuit diagram of an embodiment of the present invention, the control signal receiving system comprises a PLL synthesizer section which is identical to that shown in FIG. 2 and composed of a reference frequency oscillator 8, a reference frequency divider 9 connected to the reference frequency oscillator 8 to divide an output frequency of the oscillator 8 with a fixed dividing ratio, a frequency divider stage composed of a variable frequency divider 10 and a prescaler 11, a phase comparator 12, a voltage controlled oscillator (VCO) 13, a charge pump 14 and a loop filter 15, a control timing generator 16 and a modem/control section 6 which is identical to the modem/control section shown in FIG. 1.

Figure 3:
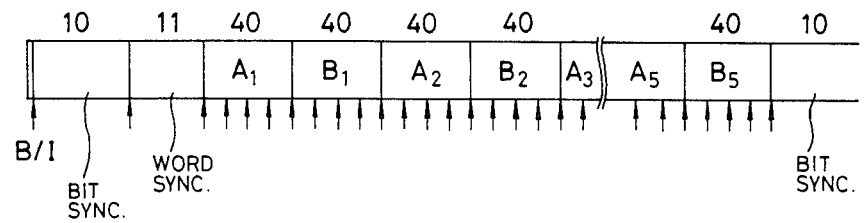
FIG. 3 illustrates an example of a control signal to be sent from a land station of the radio telephone system.

As is clear from the circuit construction shown in FIG. 4, this embodiment includes the control timing generator 16 as an addition to the conventional construction shown in FIG. 1. The control timing generator 16 is controlled by the control section 6 to control the prescaler 11 according to a timing derived from the control signal which is shown in FIG. 3.

In order to clarify the present invention, it may be necessary to describe the operation of the PLL synthesizer in more detail.

An output signal of the VCO 13 is frequency-divided by the prescaler 11 and then further divided by the variable frequency divider 10, an output of which is supplied to the comparator 12 in which it is compared in phase with an output of the reference frequency divider 9. A phase difference signal from the phase comparator 12 is supplied to the charge pump 14 and held therein. An output voltage of the charge pump 14 which corresponds to the phase difference retained therein is applied through the loop filter 15 to the VCO 13 to control an oscillation frequency thereof so that an output frequency of the frequency divider stage, i.e., an output frequency of the variable frequency divider 10 becomes equal to that of the reference signal which is the output of the reference frequency divider 9.

The output frequency of the VCO 13, i.e., the output frequency of the PLL synthesizer section 4, can be changed by changing the dividing ratio of the variable frequency divider 10. The dividing ratio of the variable frequency divider 10 depends upon a channel setting of the control section 6 as mentioned previously.

Figure 5:
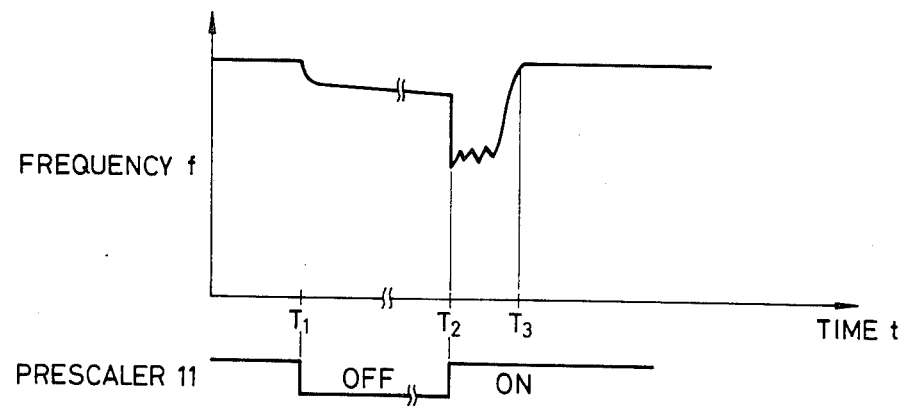
FIG. 5 is a graph showing a variation of an output frequency of a voltage controlled oscillator of the mobile station due to an on-off operation of a prescaler of the mobile station shown in FIG. 4.

As is well known, when a power supply to the prescaler 11 is terminated during a time when the output frequency of the PLL synthesizer is stable, the output frequency of the VCO 13 decreases gradually with time at a rate determined by the discharge time constant of the charge pump 14. This is shown in FIG. 5 and the reduction rate can be regulated such that the output frequency does not affect the signal receiving operation substantially for the desired time, as mentioned previously.

That is, when the prescaler 11 is turned off at a time instance T1, the output frequency f starts to decrease as mentioned above. Thereafter, when the prescaler 11 is turned on at a time instance T2, the output frequency of the VCO 13 fluctuates transiently considerably for a short time period and then is stabilized. Therefore, this transient time period from T2 to T3 can not be used to monitor the control signal reliably.

In this embodiment, the data stream A, e.g., A1, is to be monitored. Therefore, reception of the data stream A1 should be made within a time after the time instance T3 in which the output frequency of the VCO 13 is stable.

Figure 6:
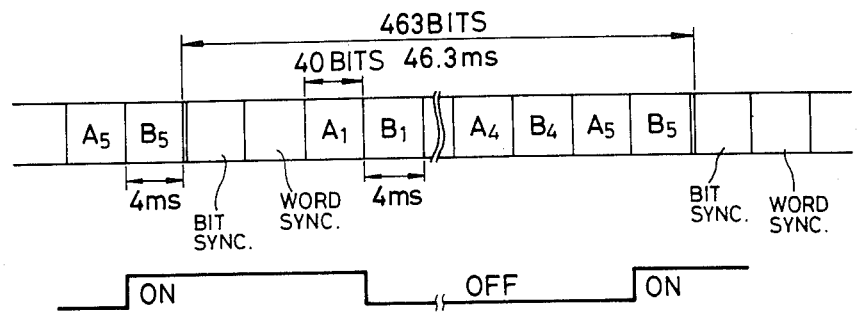
FIG. 6 is a timing chart of the on-off operation of the prescaler with respect to the control signal.

FIG. 6 illustrates the operation timing mentioned above. In FIG. 6, the time period T2 to T3 in which the output frequency of the VCO 13 fluctuates substantially is set not longer than 4 msec due to the fact that the one stream period is about 4 msec. The prescaler 11 is turned on within the period of the stream B5 which precedes the bit synchronizing signal and is unnecessary to be monitored. In the same sense, the prescaler 11 is turned off at a time after the stream A1 subsequent to termination of the word synchronizing signal, e.g., when the stream B1 is detected. With such on-off control of the prescaler 11 under the control of the control section 6, the output frequency of the VCO 13 is stable by the commencement of the bit synchronizing signal portion and is maintained stable thereafter, assuring a reliable receiving of the streams A.

Figure 7:
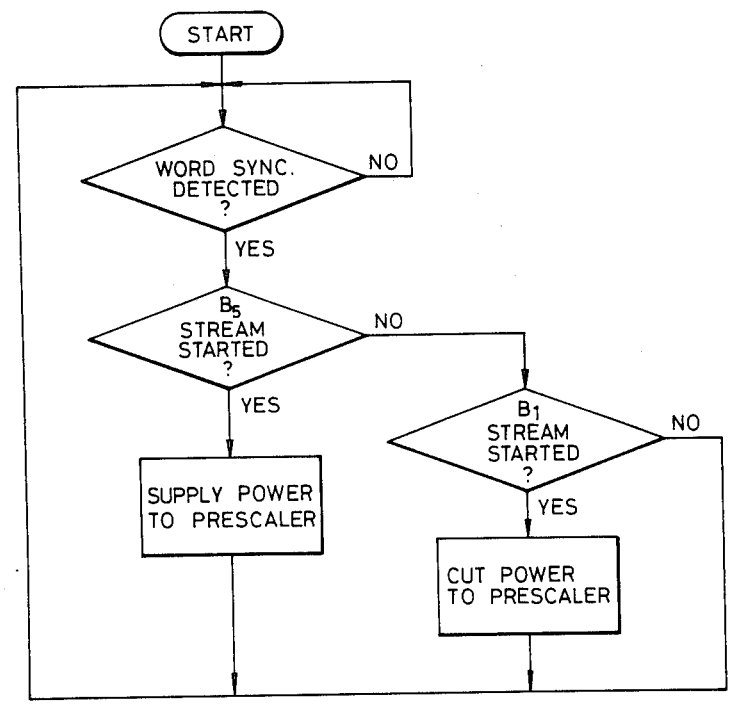
FIG. 7 is a flow chart showing an operation of the embodiment shown in FIG. 4.

FIG. 7 is a flow-chart showing the control operation for the prescaler 11. Describing this with reference to FIG. 6, when the word synchronizing signal is detected by the control section 6 by, for example, counting bits from the bit synchronizing signal, a start of the stream B5 of a subsequent frame is detected similarly upon which a power supply to the prescaler 11 is commenced. When the stream B5 is not detected, it is determined whether or not the stream B1 is detected. When the stream B1 is detected, the power supply to the prescaler 11 is stopped.

It is, of course, possible to start the power supply to the prescaler 11 at a time later than the start time of the stream B5 if the time period from T2 to T3 lapses within the period of the stream B5. Such timing can be selected easily by counting bits or by setting time widths of the various signal portions of the control signal by suitable timers, which are usually set very precisely.

In this manner, the transient time period of the VCO 13 is made to occur in the period of the stream B5 which is not to be monitored and, thus, it is possible to avoid any substantial variation of the output frequency of the PLL synthesizer 4 during the reception of the stream A, making the monitoring thereof reliable. In addition thereto, a considerable reduction of power consumption due to, mainly, the intermittent use of the prescaler is realized. It has been found that, when the prescaler 11 is on-off controlled every frame of the control signal as mentioned above, the power consumption of the mobile station is about one fifth compared with the case in which the prescaler 11 is made operative continuously.

Although the prescaler 11 is on-off controlled every frame of the control signal in this embodiment, it is possible to control it once a plurality of frames provided that the variation of the output frequency of the VCO 13 at the turning-off time of the prescaler is sufficiently small.

It is further possible to monitor another stream A2, A3, A4 or A5 instead of the stream A1 subsequent to the word synchronizing signal and to turn the prescaler 11 on in a period of the stream of the group B immediately preceding it. However, since it is necessary to use the word synchronizing signal in determining the on-off timing of the prescaler, the detection of the word synchronizing signal and/or the bit synchronizing signal must be done reliably. Therefore, it is preferable to set the on period of the prescaler 11 by taking these synchronizing signals into consideration together.

It should be noted that the present invention can be applied to not only the cellular mobile telecommunication systems but also other system utilizing similar control signals to that mentioned hereinbefore.

As described, according to the present invention, the reliable monitoring of the desired data stream received intermittently and the considerable reduction of the power consumption are realized.

What is claimed is:

1. A method of intermittently receiving necessary control data contained in a control signal transmitted, during an absence of message, from a land station to a mobile station having a PLL synthesizer section including a prescaler, said control signal containing a series of signal frames each composed of a synchronizing signal portion followed by a control data portion, said control data portion being composed of at least two data stream groups each including a plurality of data streams having identical content, said data streams of a first one of said data stream groups being arranged alternately with said data streams of a second data stream group, said necessary control data being contained in said data streams of said first one of said data stream groups, said method comprising the steps of:

commencing an operation of said prescaler during a period corresponding to one of said data streams contained in said second data stream group so that an initial unstable operation of said PLL synthesizer section is performed within said period, continuing the operation of said prescaler until at least one necessary data stream is received and said PLL synthesizer section operates stably, and terminating the operation of said prescaler at least after a termination of said at least one necessary data stream.

2. The method as claimed in claim 1, wherein said at least one necessary data stream is subsequent to said synchronizing signal portion, and said one of said data streams contained in said second data stream group immediately precedes said synchronizing signal portion.

3. The method as claimed in claim 1 or 2, wherein said commencing step and said terminating step are timed by counting bits from a detection of said synchronizing signal portion.

4. An intermittent control signal receiving system for receiving necessary data contained in a control signal containing a series of signal frames each composed of a synchronizing signal portion followed by a control data portion, said control data portion being composed of at least two data stream groups each having identical content, said data streams of a first one of said data stream groups being arranged alternately with said data streams of a second data stream group, said necessary control data being contained in said data streams of said first one of said data stream groups, comprising an antenna, an antenna duplexer connected to said antenna, a receiver section having an input connected to an output of said antenna duplexer, a PLL synthesizer section operatively connected to said receiver section for converting a received signal into an intermediate frequency signal, said PLL synthesizer section including a voltage controlled oscillator, a frequency divider stage for dividing an output frequency of said voltage controlled oscillator, a phase comparator for comparing an output of said frequency divider stage and a reference frequency signal and a charge pump having an input connected to said phase comparator and an output connected to said voltage controlled oscillator for holding an output signal of said phase comparator, a control section operatively connected to said receiver section for controlling operation of said receiving system, and control timing means responsive to an output of said control section for controlling operation of said frequency divider stage such that power is supplied to said frequency divider stage when one of said data streams of said second data stream group is detected by said control section and said power supply to said frequency divider stage is stopped after said necessary data stream is detected by said control section.

5. The intermittent receiving system according to claim 4, wherein said frequency divider stage comprises a variable frequency divider having an output connected to said phase comparator and a prescaler having an output connected to an input of said variable frequency divider and an output connected to an input of said variable frequency divider and an input connected to said voltage controlled oscillator, said prescaler being controlled by said control timing means.

6. The intermittent receiving system according to claim 5, wherein said control timing means comprises a control timing generator and a switching means for selectively supplying said power to said prescaler, said control timing generator being responsive to an output signal of said control section indicating detection of the start of said one of said data streams of said second data stream group to generate a first timing signal for closing said switching means so as to supply said power to said prescaler and responsive to an output of said control section indicating detection of the termination of said necessary data stream for generating a second timing signal to open said switching means to thereby stop the power supply to said prescaler.

* * * * *